United States Patent [19]
Krainer et al.

[11] Patent Number: 5,471,016
[45] Date of Patent: Nov. 28, 1995

[54] APPARATUS HAVING AT LEAST ONE BATTERY SECURED TO A PRINTED CIRCUIT BOARD

[75] Inventors: Erich Krainer; Martin Sonnek, both of St. Veit and der Glan, Austria

[73] Assignee: U.S. Philips Corporation, New York, N.Y.

[21] Appl. No.: 215,441

[22] Filed: Mar. 18, 1994

[30] Foreign Application Priority Data

Apr. 1, 1993 [AT] Austria .................................. 673/93

[51] Int. Cl.⁶ ..................................................... A05K 1/00
[52] U.S. Cl. ........................ 174/254; 174/260; 174/262; 361/760
[58] Field of Search ........................... 174/260, 262, 174/265, 267, 268, 254; 361/760, 777; 428/901

[56] References Cited

U.S. PATENT DOCUMENTS 3,953,663  4/1976  Kelhm ........................... 174/262

FOREIGN PATENT DOCUMENTS 0432331  6/1991  European Pat. Off. .

*Primary Examiner*—Leo P. Picard
*Assistant Examiner*—Cheryl R. Figlin

[57] ABSTRACT

In an apparatus (1) with at least one battery (12, 13) mounted on a printed circuit board (14) the printed circuit board (14) has mounting portions (23, 24, 25, 26) which can be broken off this printed circuit board, solder lugs (19, 20, 21, 22) which project from terminals (15, 16, 17, 18) of the battery (12, 13) being fixedly connected to said mounting portions by a soldered joint (27) each. Each mounting portion (23, 24, 25, 26) of the printed circuit board (14) is surrounded by the remainder of the printed circuit board (14) and an opening (28, 29, 30, 31), which partly surrounds the relevant mounting portion (23, 24, 25, 26), is formed between each mounting portion (23, 24, 25, 26) and the remainder of the printed circuit board (14) and each mounting portion (23, 24, 25, 26) is connected to the remainder of the printed circuit board (14) by a connecting portion (40, 41, 42, 43) of the printed circuit board (14), which connecting portion is situated between the two ends (32, 33, 34, 35, 36, 37, 38, 39) of an opening (28, 29, 30, 31).

6 Claims, 4 Drawing Sheets

APPARATUS HAVING AT LEAST ONE BATTERY SECURED TO A PRINTED CIRCUIT BOARD

The invention relates to an apparatus having a printed circuit board and at least one battery mounted on the printed circuit board, which battery is intended for powering the apparatus and has two terminals, each provided with a solder lug which is fixedly connected to a mounting portion of the printed circuit board by means of a solder joint, which mounting portions of the printed circuit board can be severed from the remainder of the printed circuit board to enable the at feast one battery to be removed from the apparatus.

An apparatus of the type defined in the opening paragraph is known, for example from EP 0,432,331 A2, reference being made particularly to the embodiments shown in FIGS. 29 to 36 of this EP 0,432,331 A2, for which protection is claimed by the independent claim 3 of EP 0,432,331 A2. The mounting portions of the printed circuit board in the known apparatus are peripheral portions of the printed circuit board, which portions terminate in an edge zone of the printed circuit board and have at least one freely accessible bounding edge. Moreover, in the known apparatus a breaking line is formed in each connecting portion between a mounting portion and the remainder of the printed circuit board, which breaking line is formed, for example, by groove-like recesses or by holes of circular cross-section traversing the printed circuit board at the location of a connecting portion and disposed one after the other in the direction of a breaking line. In all the embodiments of the known apparatus the above construction enables the mounting portion to be severed by hand from the remainder of the printed circuit board, which may be effected directly at the break-away mounting portions or at the battery, which is connected to the mounting portion. However, all the embodiments of the known apparatus have the disadvantage that a battery can only be mounted on a printed circuit board in its peripheral area because the mounting portions for mounting the battery can be situated only at the periphery of a printed circuit board to enable them to be broken away by hand. However, this puts a restraint on the freedom to choose the location of a battery on a printed circuit board, which is a disadvantage particularly in the case of apparatuses whose construction should be as compact as possible, such as battery-powered shavers, battery-powered toothbrushes, battery-powered pocket calculators and many other compact battery-powered apparatuses.

It is an object of the invention to solve the above problems with an apparatus of the type defined in the opening paragraph and to provide a simple possibility of mounting a battery in any desired geometrical arrangement on a printed circuit board without any restraint as to the position of the battery and, with a battery thus mounted, to enable the mounting portions of the printed circuit board to be simply severed from the remainder of the printed circuit board. To this end the invention is characterized in that each mounting portion of the printed circuit board is surrounded by the remainder of the printed circuit board, and an opening is formed between each mounting portion and the remainder of the printed circuit board, which opening partly surrounds the relevant mounting portion, and each mounting portion is connected to the remainder of the printed circuit board by a connecting portion of the printed circuit board, which connecting portion is situated between the two ends of each opening, which mounting portions, which are each situated within an opening, can each be severed from the remainder of the printed circuit board substantially at the location of a connecting portion, preferably by means of a tool. In this way it is achieved that a battery can be mounted on a printed circuit board in any desired position, i.e. also in such a position that both mounting portions for a battery are situated in a central area of a printed circuit board and that, with a battery thus mounted, the mounting portions of printed circuit board can be severed simply from the remainder of the printed circuit board in order to remove the battery from the apparatus. The construction in accordance with the invention does not require the provision of a separate breaking line in the connecting portion between a mounting portion and the remainder of the printed circuit board because owing to the shape of the opening which partly surrounds the mounting portion each mounting portion is always severed between the two ends of the opening at the location of the connecting portion which is situated there, the shape of the relevant breaking zone being irrelevant.

Each opening may occupy any desired position relative to a battery, which has its solder lug connected to the mounting portion, which is surrounded by the opening. However, it has proved to be very advantageous if each opening extends transversely of the longitudinal axis of a battery, and the two ends of two openings each time face one another, which openings partly bound two mounting portions to which the two solder lugs of a battery are each fixedly connected by means of a solder joint. This has proved to be very advantageous in practice because it enables a very easy and rapid removal of a battery from a printed circuit board and, as a consequence, from an apparatus.

Each of the openings may be, for example, V-shaped. However, it has proved to be advantageous if each opening is substantially C-shaped, which has appeared to be particularly favourable in practice.

Each substantially C-shaped opening may be, for example, have an oval-like, circle-like or other kind of shape. However, it has proved to be very advantageous if each mounting portion is rectangular in shape, and each opening consists of straight parts. This is advantageous for a simple and proper soldering of the solder lugs on the mounting portions.

The invention will now be described in more detail with reference to the drawings which show some exemplary embodiments to which the invention is not limited.

Figure 3:
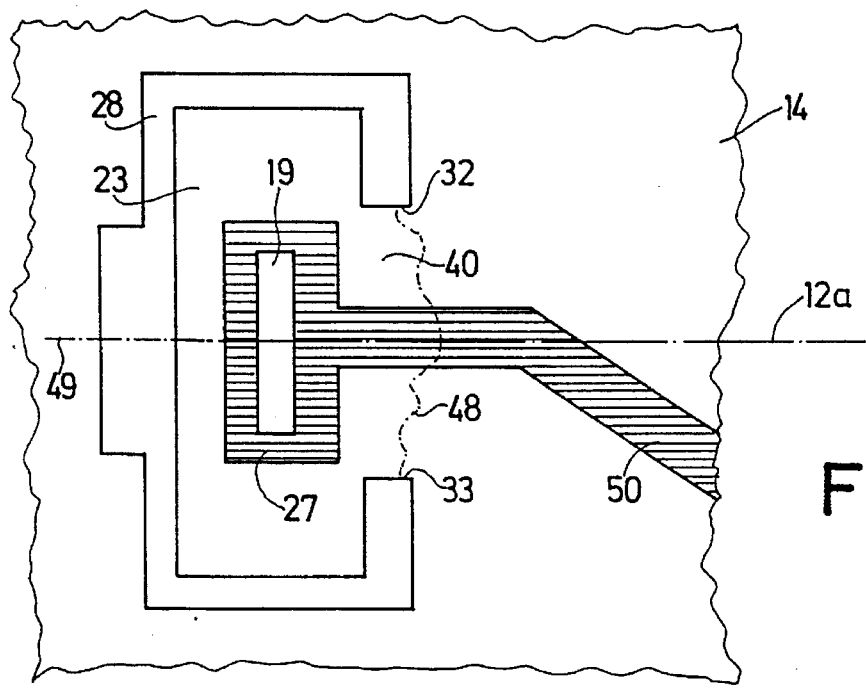
FIG. 3 is an underneath view showing a part of the printed circuit board of FIG. 2 to a larger scale than FIG. 2, illustrating the structure of a substantially rectangular mounting portion for a solder lug which projects from a battery terminal and the structure of a substantially C-shaped opening which partly surrounds the mounting portion.
Figure 5:
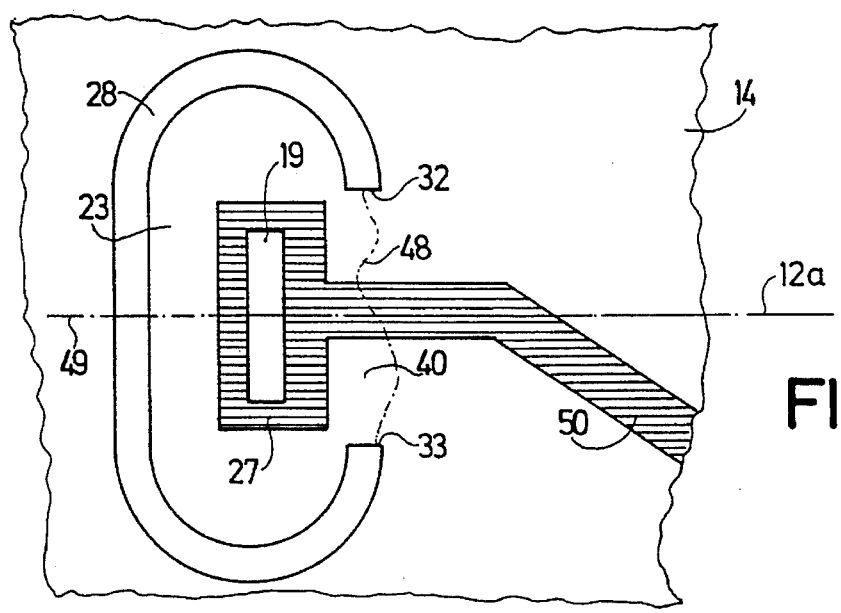

FIG. 5, in a similar way to FIG. 3, shows a part of a printed circuit board of an apparatus in a second embodiment of the invention, illustrating the structure of a substantially oval mounting portion for a solder lug and the structure of a substantially oval ring-sector-shaped opening which partly surrounds the mounting portion.

Figure 6:
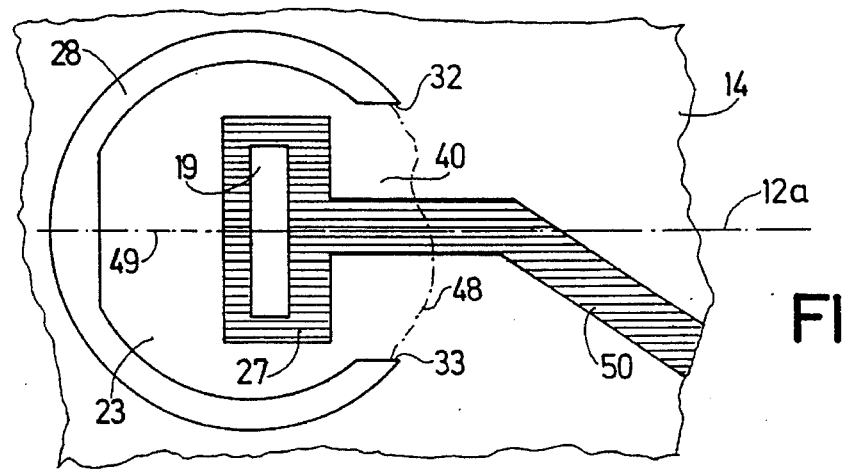

FIG. 6, in a similar way to FIGS. 3 and 5, shows a part of a printed circuit board of an apparatus in a third embodiment of the invention, illustrating the structure of a substantially circular mounting portion for a solder lug and the structure of a substantially circular ring-sector-shaped opening which partly surrounds the mounting portion.

Figure 7:
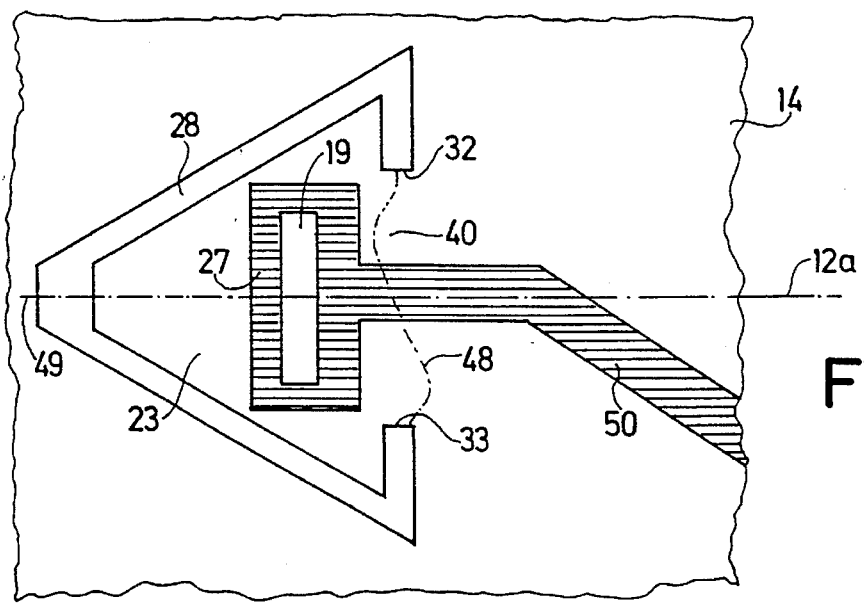

FIG. 7, in a similar way to FIGS. 3, 5 and 6, shows a part of a printed circuit board of an apparatus in a fourth embodiment of the invention, illustrating the structure of a substantially trapezoidal mounting portion for a solder lug and the structure of a substantially trapezoidal opening which partly surrounds the mounting portion.

Figure 8:
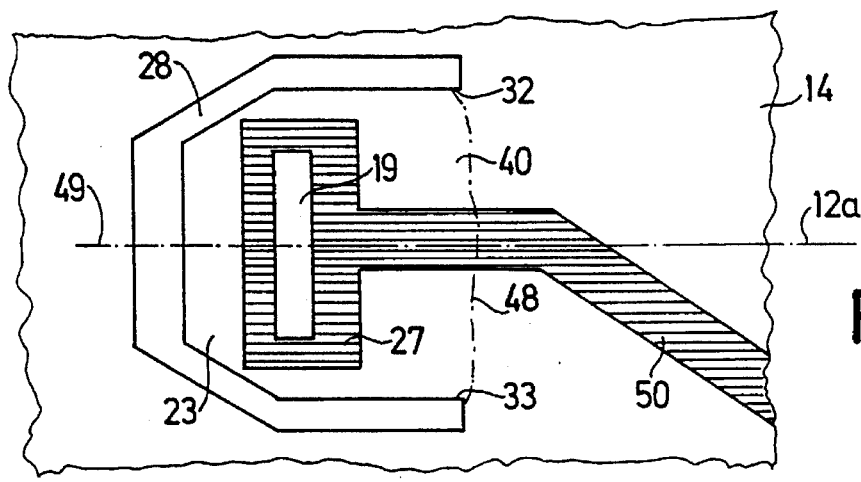

FIG. 8, in a similar way to FIGS. 3, 5, 6 and 7, shows a part of a printed circuit board of an apparatus in a fifth embodiment of the invention, illustrating the structure of a substantially hexagonal mounting portion for a solder lug and the structure of a substantially U-shaped opening which partly surrounds the mounting portion.

Figure 9:
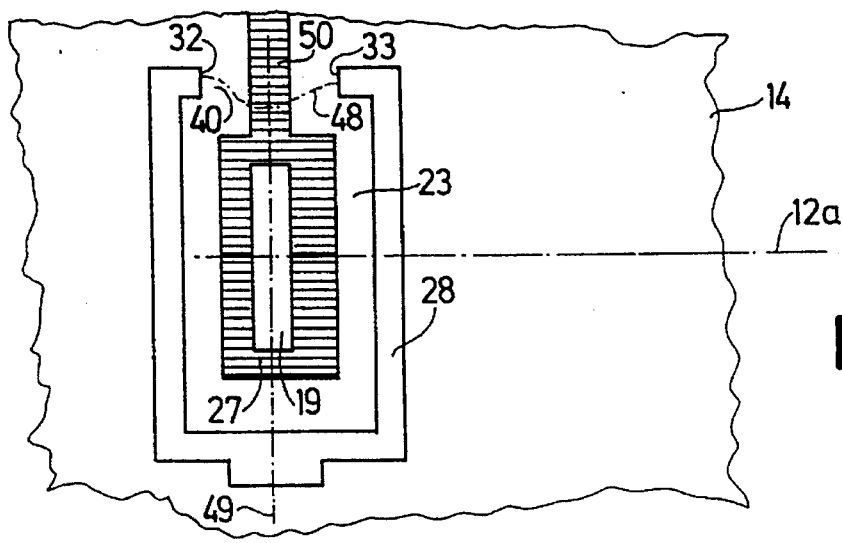

FIG. 9 shows a part of a printed circuit board of an apparatus in a sixth embodiment of the invention, illustrating the structure of a substantially rectangular mounting portion for a solder lug and the structure of a substantially C-shaped opening which partly surrounds the mounting portion, a line of symmetry of the mounting portion and of the opening extending substantially perpendicularly to the longitudinal axis of a battery.

Figure 10:
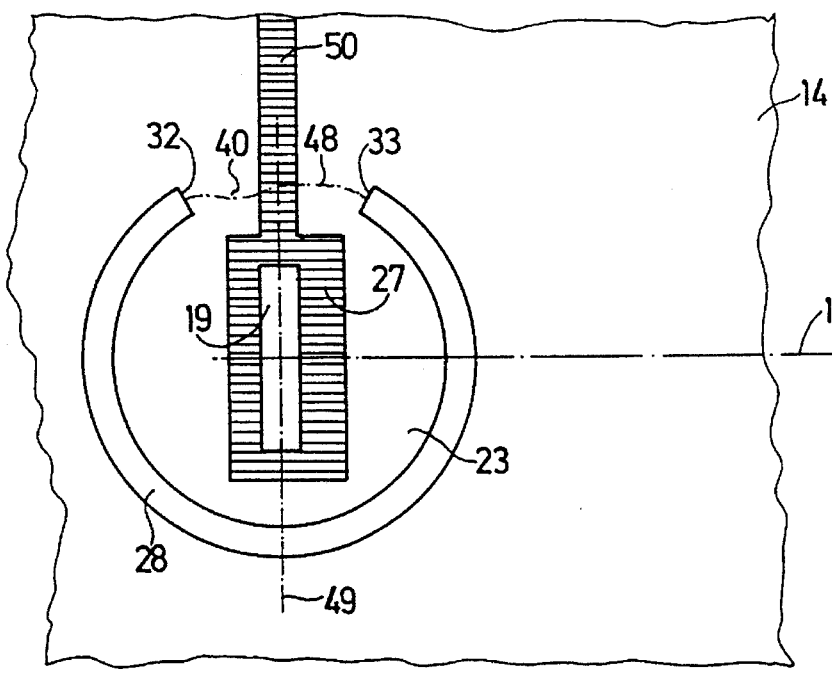

FIG. 10, in a similar way to FIGS. 3, 5, 6, 7, 8 and 9, shows a part of a printed circuit board of an apparatus in a seventh embodiment of the invention, illustrating the structure of a substantially circular mounting portion for a solder lug and the structure of a substantially circular ring-sector-shaped opening which partly surrounds the mounting portion, a line of symmetry of the mounting portion and of the opening extending perpendicularly to the longitudinal axis of a battery.

Figure 1:
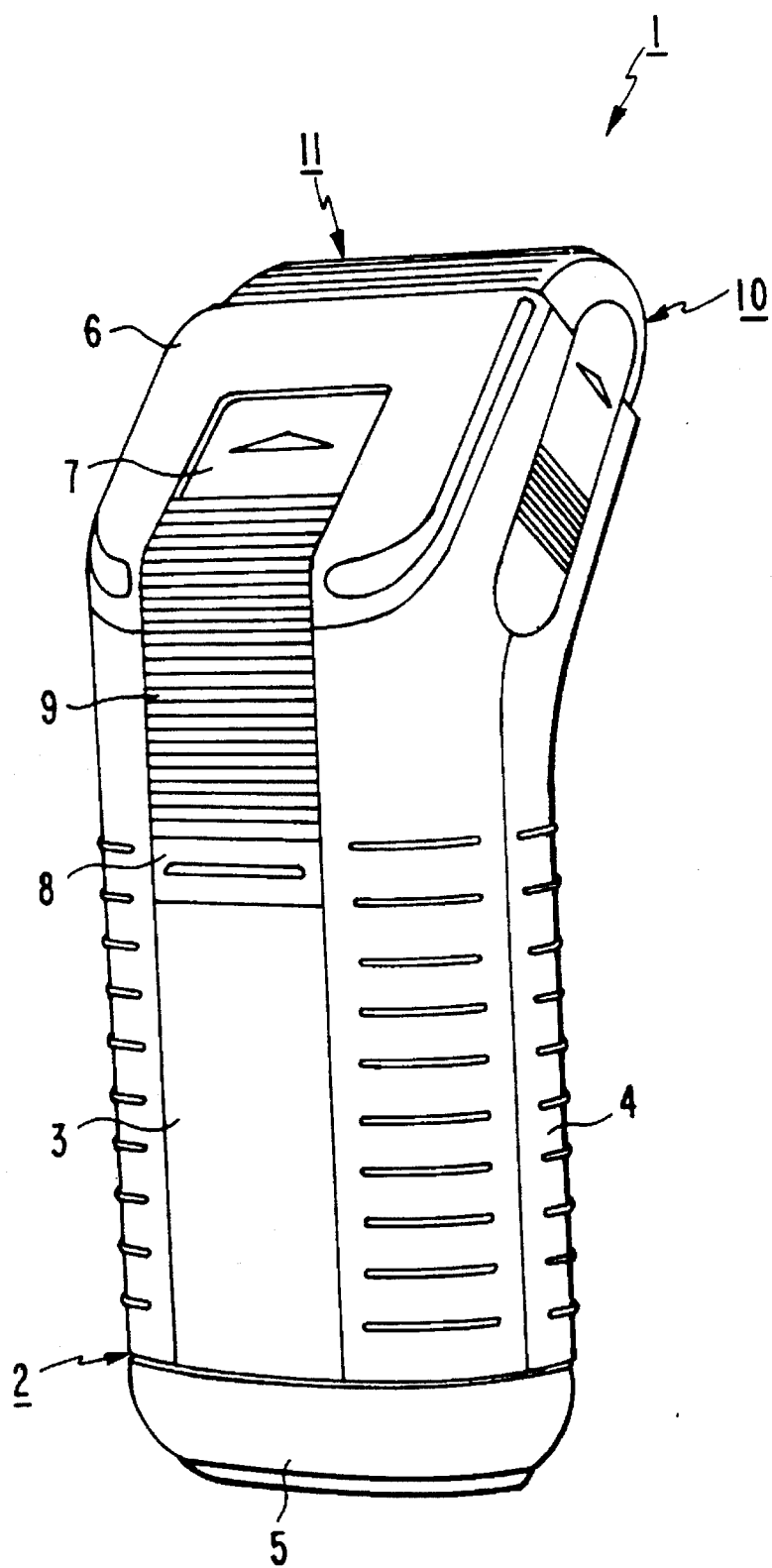
FIG. 1 is an oblique view of a first embodiment of the invention in the form of a shaving apparatus comprising a shaving means and a trimming means, the drivable cutters of both means being drivable by a motor which can be electrically powered by means of two batteries secured to a printed circuit board of the shaving apparatus.

FIG. 1 shows a first embodiment of the invention, in the present example a shaving apparatus 1 having a housing 2 comprising two interconnected housing halves 3 and 4 completed by a trough-shaped housing section 5 at the bottom. A trimmer, not shown in FIG. 1, is arranged at the location of the housing half 3 and is movable between a rest position, in which it is retracted into the shaving apparatus 1, and an operating position, in which it is slid out of the shaving apparatus 1, said trimmer being concealed by a cover plate 6 in the rest position so that only a cutter support 7 of the trimmer is partly visible. To move the trimmer, not shown in FIG. 1, the shaving apparatus 1 has an actuating element 8, which is connected to the cutter support 7 of the trimmer by a shutter-like flexible coupling member 9.

A shaving head 10 is mounted on the housing 2 of the shaving apparatus 1 and is detachably connected to the housing 2. The shaving head 10 has a foil-like upper cutter, which can also be covered by means of a shutter-like cover 11, which is movable substantially parallel to the main wall of the housing half 4 between a cover position shown in FIG. 1, in which it covers the foil-like upper cutter, and an open position, in which it exposes the shear foil to permit shaving.

To drive a lower cutter which cooperates with a foil-like upper cutter and to drive a drivable cutter of the trimmer of the shaving apparatus 1 the apparatus 1 has a drive motor accommodated in the housing 2. Two rechargeable batteries 12 and 13 are arranged inside the apparatus housing 2 for the power supply to this motor.

Figure 2:
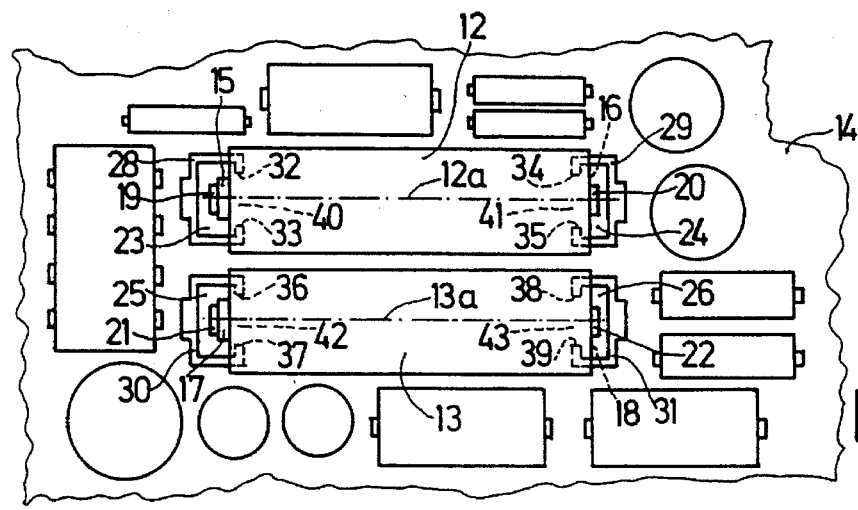
FIG. 2 shows a part of the printed circuit board in the shaving apparatus of FIG. 1, to which board the two batteries for powering the motor of the shaving apparatus of FIG. 1 are secured.

As is shown in FIG. 2, the two rechargeable batteries 12 and 13 are fixedly connected to a printed circuit board 14, which is secured in the apparatus housing 2. In addition to the two batteries 12 and 13 the printed circuit board 14 carries further parts, which bear no references for the sake of simplicity.

Each of the two batteries 12 and 13 has two terminals 15, 16 and 17, 18 respectively. Each of these terminals 15, 16, 17 and 18 has a solder lug 19, 20, 21 and 22, respectively. Each of the solder lugs 19, 20, 21 and 22 is fixedly connected to a mounting portion 23, 24, 25 and 26, respectively, by a soldered joint 27, as illustrated for the solder lug 19 in FIG. 4. The mounting portions 23, 24, 25 and 26 of the printed circuit board 14 can be severed from the remainder of the board 14 in order to enable the batteries 12 and 13 to be removed from the shaving apparatus 1.

In the shaving apparatus shown in FIG. 1 each mounting portion 23, 24, 25 and 26 of the printed circuit board 14 is surrounded by the remainder of the printed circuit board 14 and a slot-like opening 28, 29, 30 and 31, respectively, is formed between each mounting portion 23, 24, 25 and 26 and the remainder of the printed circuit board 14, which opening partly surrounds the relevant mounting portion 23, 24, 25 and 26, respectively, said mounting portions 23, 24, 25 and 26 each being connected to the remainder of the printed circuit board 14 by a respective connecting portion 40, 41, 42 or 43 of the printed circuit board 14, which connecting portion is situated between the two ends 32, 33; 34, 35; 36, 37 and 38, 39, respectively, of each opening 28, 29, 30 and 31, respectively, which mounting portions 23, 24, 25 and 26, which are situated within the openings 28, 29, 30 and 31, respectively, can each be severed from the remainder of the printed circuit board 14 substantially at the location of a connecting portion 40, 41, 42 or 43, preferably by means of a tool 44.

Figure 4:
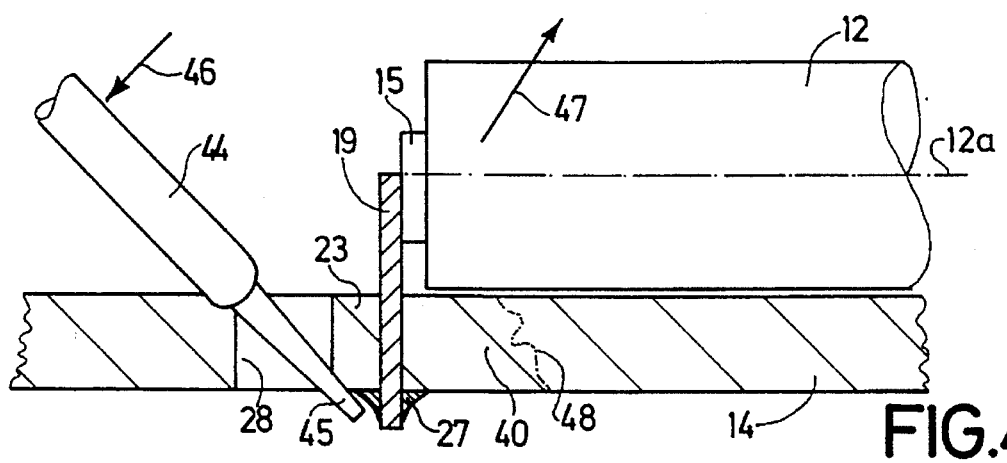
FIG. 4 is an cross-sectional view showing a part of the printed circuit board of FIGS. 2 and 3 to a larger scale than FIG. 2, illustrating the connection of a solder lug to a mounting portion for this lug and the manner in which this mounting portion can be severed from the remainder of the printed circuit board.

The tool 44 for severing a mounting portion 23, 24, 25 or 26 may be, for example, a screwdriver 44, whose free end 45 is passed through an opening 28, 29, 30 or 31, as is shown in FIG. 4 for the opening 28. By pressing the screwdriver downward in a direction indicated by an arrow 46 the mounting portion 23 is broken off the remainder of the printed circuit board 14 in a direction indicated by an arrow 47. Each mounting portion 23, 24, 25 or 26 always breaks off at the location of the connecting portion 40, 41, 42 or 43 situated between the two ends 32, 33; 34, 35; 36, 37 or 38, 39, respectively, of a respective opening 28, 29, 30 or 31 as a result of the shape of the opening 28, 29, 30 or 31, which partly surrounds the mounting portion 23, 24, 25 or 26, the shape of the relevant breaking zone being wholly irrelevant. In FIGS. 3 and 4 such a breaking zone 48 is only shown diagrammatically by means of a dash-dot line. However, a mounting portion 23, 24, 25 or 26 can also be broken away by hand, particularly by means of a finger.

By means of the above construction of the printed circuit board, in which each mounting portion is surrounded by the remainder of the printed circuit board and a slot-like opening is formed between each mounting portion and the remainder of the printed circuit board, which opening partly surrounds the relevant mounting portion, each mounting portion being connected to the remainder of the printed circuit board by a respective connecting portion of the printed circuit board, which connecting portion is situated between the two ends of each opening, it is achieved that any battery can be mounted on a printed circuit board in any desired position, i.e. also in such a position that both mounting portions for one battery are disposed in a central area of a printed circuit board, as is actually the case with the printed circuit board shown in FIG. 2, and that with a battery thus mounted the mounting portions of the printed circuit board can simply be severed from the remainder of the printed circuit board in order enable a battery to be removed from the shaving apparatus.

In the shaving apparatus 1 shown in FIG. 1, as is shown in FIGS. 2 and 3, each of the openings 28, 29, 30 and 31 extends transversely of the longitudinal axis of a battery 12 or 13. The arrangement has been selected in such a manner that in a plan view of the printed circuit board 14, as is shown for the opening 28 in FIG. 3, a line of symmetry 49 of an opening 28, 29, 30 or 31 and a longitudinal axis 12a or 13a of a battery coincide. Moreover, in the case of the printed circuit board 14 as shown in FIGS. 2, 3 and 4 the two ends 32, 33; 34, 35; 36, 37 or 38, 39, respectively, of each time two openings 28, 29 and 30, 31, respectively, face one another, which openings partly bound two mounting portions 23, 24 and 25, 26, respectively, to which the two respective solder lugs 19, 20 or 21, 22 of a battery 12 or 13 are fixedly connected by means of a solder joint 27. Such a construction has proved to be very favourable in practice because it enables a particularly easy and rapid removal of a battery from a printed circuit board and from an apparatus.

As is shown in FIGS. 2 and 3, each of the openings 28, 29, 30 and 31 in the printed circuit board 14 shown in FIGS. 2 and 3 is substantially C-shaped because this has proved to be particularly favourable in practice. Each of the mounting portions 23, 24, 25 and 26 is rectangular and each of the openings 28, 29, 30 and 31 consists of substantially straight parts. This has proved to be very advantageous for a simple and proper soldering of the solder lugs to the mounting portions. The openings 28, 29, 30 and 31 can be formed in an advantageous manner, substantially without any additional expense, during punching of the holes for the insertion or passage of the leads of the parts to be mounted on a printed circuit board.

It is to be noted also that each solder joint 27 connects one solder lug 19, 20, 21 or 22 mechanically and electrically to a printed conductor 50 of the printed circuit board 14, as is shown in FIG. 3.

In the case of the printed circuit board 14 of an apparatus in a second embodiment of the invention, which is shown partly in FIG. 5, the mounting portions are substantially oval and the slot-like openings have an oval sector shape corresponding to the oval shape of the mounting portions, as is shown for the mounting portion 23 and the opening 28 in FIG. 5.

In the case of the printed circuit board 14 of an apparatus in a third embodiment of the invention, which is shown partly in FIG. 6, the mounting portions have a circular shape flattened at two opposite sides and slot-like openings have a substantially circular sector shape corresponding to the shape of the mounting portions, as is shown for the mounting portion 23 and the opening 28 in FIG. 6.

Further examples of mounting portions and slotted openings have been provided in the two printed circuit boards 14 of two apparatuses in accordance with a fourth and a fifth embodiment of the invention, shown partly in FIGS. 7 and 8, in which in the same way as the printed circuit boards 14 in FIGS. 2, 3, 4, 5 and 6 a line of symmetry 49 of an opening 28, 29, 30 or 31 and a longitudinal axis 12a or 13a of a battery 12 or 13 coincide in a plan view of the printed circuit board 14, as is shown for the opening 28 in FIGS. 7 and 8.

FIGS. 9 and 10 partly show two apparatuses in accordance with a sixth and a seventh embodiment of the invention, comprising further examples of mounting portions and slotted openings, a line of symmetry 49 of an opening 28, 29, 30 or 31 extending perpendicularly to a longitudinal axis 12a or 13a of a battery 12 or 13 in a plan view of the printed circuit board 14, as is shown for the opening 28.

In all the apparatuses whose printed circuit boards 14 are shown in FIGS. 5 to 10 the batteries can be arranged in any desired position, a simple removal of the batteries from the apparatuses being guaranteed.

The invention is not limited to the variants described above because the mounting portions of a printed circuit board and the openings which partly surround the mounting portions may have other shapes than those in the exemplary embodiments described and shown herein. A mounting portion and the opening which partly surrounds this mounting portion need not be mirror-symmetrical. A mounting portion and the opening which partly surrounds this mounting portion may also be laterally offset relative to a longitudinal axis of a battery. Moreover, a mounting portion and the opening which partly surrounds this mounting portion, which are for example mirror-symmetrical relative to a line of symmetry, may be in an angular position which differs from 90° relative to a longitudinal axis of a battery, the line of symmetry of the mounting portion, or of the opening which partly surrounds this mounting portion, and the longitudinal axis of a battery then enclosing an angle which differs from 90°.

We claim:

1. An apparatus comprising a printed circuit board (14) and at least one battery (12, 13) mounted on a surface of the printed circuit board (14), which said at least one battery is intended for powering the apparatus and has two terminals (15, 16, 17, 18), provided on at least one surface of the said at least one battery (12, 13), each terminal provided with a solder lug (19, 20, 21, 22) which is fixedly connected to a mounting portion (23, 24, 25, 26) of the printed circuit board (14) by means of a solder joint (27), which mounting portions (23, 24, 25, 26), situated on a surface of the printed circuit board (14), can be severed from the remainder of the printed circuit board (14) to enable the said at least one battery (13, 14) to be removed from the apparatus, characterized in that each mounting portion (23, 24, 25, 26) of the printed circuit board (14) is surrounded by the remainder of the printed circuit board (14), and is partially separated therefrom by an opening (28, 29, 30, 31) formed in the printed circuit board (14) between each mounting portion (23, 24, 25, 26) and the remainder of the printed circuit board (14), which opening partly surrounds the relevant mounting portion (23, 24, 25, 26) and which opening 28, 29, 30, 31 has two ends opposing (32, 33; 34, 35; 36, 37; 38, 39), and each mounting portion (23, 24, 25, 26) is connected to the remainder of the printed circuit board (14) by a connecting portion (40, 41, 42, 43) of the printed circuit board (14), which connecting portion is situated between the two ends (32, 33, 34, 35, 36, 37, 38) of each opening (28, 29, 30, 31), which mounting portions (23, 24, 25, 26), which are each situated within an opening (28, 29, 30, 31), can each be severed from the remainder of the printed circuit board (14) substantially at the location of a connecting portion (40, 42, 42, 43).

2. An apparatus as claimed in claim 1, characterized in that a portion of each opening (28, 29, 30, 31) extends transversely of the longitudinal axis (12a, 13a, 12a) of said at least one, battery (12, 13), and the two ends (32, 33; 34, 35; 36, 37; 38, 39;) of each opening (29, 30, 31) face one another, which surround two mounting portions (23, 24, 25, 26; 23) to which the two solder lugs (20, 21, 22; 19) of a battery (12, 13) are each fixedly connected by means of a solder joint (27).

3. An apparatus as claimed in claim 1, characterized in that each opening (28, 29, 30, 31; 28) is substantially C-shaped.

4. An apparatus as claimed in claim 3, characterized in that each mounting portion is rectangular in shape, and each opening (28, 29, 30, 31; 28) consists of straight parts.

5. An apparatus as claimed in claim 2 characterized in that each opening is substantially C-shaped.

6. An apparatus as claimed in claim 1, wherein a portion of each opening (28, 29, 30, 31) extends transversely of the longitudinal axis (12a, 13a) of said at least one battery (12, 13).

\* \* \* \* \*